United States Patent [19]
Allen et al.

[11] Patent Number: 5,424,224
[45] Date of Patent: Jun. 13, 1995

[54] METHOD OF SURFACE PROTECTION OF A SEMICONDUCTOR WAFER DURING POLISHING

[75] Inventors: Franklin L. Allen; Eugene C. Davis, both of Sherman; Lawrence D. Dyer, Richardson; Jerry B. Medders, Van Alstyne; Vikki S. Simpson; Jerry D. Smith, both of Sherman; Michael Cunningham, Anna; John B. Robbins, Sherman, all of Tex.

[73] Assignee: Texas Instruments Incorporated, Dallas, Tex.

[21] Appl. No.: 5,713

[22] Filed: Jan. 19, 1993

[51] Int. Cl.⁶ ............................ H01L 21/306
[52] U.S. Cl. ............................................. 437/10
[58] Field of Search ............... 156/631, 632, 636, 641, 156/645; 437/231, 10

[56] References Cited
U.S. PATENT DOCUMENTS 4,384,919  5/1983  Casey .
4,588,473  5/1986  Hisatomi et al. ................ 156/636
5,071,776  12/1991  Matsushita ....................... 437/10
5,128,281  7/1992  Dyer et al. ........................ 156/645

FOREIGN PATENT DOCUMENTS 0297648  1/1989  European Pat. Off. ........... 156/636
63-132324  6/1987  Japan ................................. 156/631
63-117427  5/1988  Japan ................................. 156/631

Primary Examiner—Brian E. Hearn
Assistant Examiner—Lynne A. Gurley
Attorney, Agent, or Firm—W. James Brady, III; Richard L. Donaldson

[57] ABSTRACT

The protection to the backside of the semiconductor wafer is accomplished by applying a layer of silicon oxide or silicon nitride or other deposited material to the back surface of a semiconductor wafer to protect against particles, scratches, and etching by mild caustic solutions. The layer remains in place during all three processes, edge pre-polish, mirror edge polish, and wafer polish.

8 Claims, 2 Drawing Sheets

METHOD OF SURFACE PROTECTION OF A SEMICONDUCTOR WAFER DURING POLISHING

FIELD OF THE INVENTION

This invention relates to semiconductor wafers, and more particularly to a method of backside protection during edge and wafer surface polishing and to methods of mounting during polishing.

BACKGROUND OF THE INVENTION

When silicon wafer edges are abrasively polished using present methods, silicon and abrasive particles adhere to the surfaces of the wafer and are difficult to remove.

Also, when silicon wafer edges are chem-mechanically polished, as in U.S. Pat. No. 5,128,281, the wafer surfaces adjacent to the edges etch slightly because of attack by the warm alkaline polish slurry.

Prior art methods have applied films such as photoresist or wax to protect on the back of the wafer. These methods have disadvantages in that materials, equipment and labor are expensive to apply and remove the films. In later processing, the wafer cannot be polished sufficiently flat with the layer in place, and the methods do not protect against "slurry rings". The abrasive edge polish process sometimes lifts a portion of the film away from the wafer, allowing etching under the film in later processing. Wax or photoresist protection involves the extra steps of application and removal.

Another process used in prior art methods of particle removal is to etch the wafer with an acid or caustic solution after abrasive edge polishing. This has the disadvantage of removing extrinsic gettering sites (backside damage).

Prior art mounting systems predominantly used for single sided polishing of semiconductor wafers are template mounting and backside wax mounting. Template mounting involves the mounting of a template assembly, composed of a poromeric backing material which contacts the backside of the wafer, and a fiberglass/urethane retainer which surrounds the outer diameter of the wafer. The assembly is mounted on a polishing block. The poromeric backing film compresses non-uniformly during the polishing process, and high quality flatness and taper control can not be achieved. The film also increases greatly the cost of templates and reduces productivity.

In backside wax mounting, a layer of wax approximately 4 mils in thickness is deposited on the backside of the wafer, then the wafer is mounted onto a polishing block. Following the polish process, the wafer is demounted from the block and the wax is stripped from the wafer. Four problems with the wax mounting process are: (1) the uniformity of the wax layer is critical to achieving high quality flatness; (2) the wax residues contribute to high particles on the wafer; and (3) particles which are entrapped in the wax layer cause high points, or "dimples" in the polished wafer surface; and there is a yield loss associated with the demounting and the other steps.

SUMMARY OF THE INVENTION

The invention is to a method for protecting the backside of a semiconductor wafer during polishing. The method solves the problems of particle adherence, backside etching at mirror edge polish, staining of the back surface, the need for a poromeric backing film in template polishing and backside scratches from mounting on polish blocks, and back reference flatness achievement without wax mounting.

The protection to the backside of the semiconductor wafer is accomplished by applying a layer of material to the backside of the semiconductor wafer that is known to protect against particles, scratches, and etching by mild caustic solutions. The layer remains in place during all three processes, edge pre-polish, mirror edge polish, and wafer polish, or any combination thereof.

The layer is an oxide or nitride layer such as deposited by a CVD or plasma reactor. One layer used is an oxide layer of Silox. Any portion of the layer that wraps around the rounded edge can be abraded away by the abrasive wheel pre-polish without lifting the layer. The layer protects during the chem-mechanical mirror edge polish step without introducing a high friction or self-adhesive layer. Existing clean up process after polishing includes a hydrofluoric acid treatment, which removes the layer without any added chemical step.

Another aspect of the invention is that the oxide or nitride layer protects the back surface when the wafer is mounted directly to a polishing block, and held in position by using only the fiberglass template portion of the template assembly. The back reference for the polished wafer is the polishing block. The protective layer also permits wafers to be single sided polished on a double-side polishing machine, which produces the highest quality of flatness currently available.

Another advantage of the invention is that it makes easier the application of the mirror edge polish process (e.g. U.S. Pat. No. 5,128,281) and its advantages. One such is to avoid sources of misfit dislocation nucleations during epitaxial deposition.

The technical advance represented by the invention, as well as the objects thereof, will become apparent from the following description of a preferred embodiment of the invention when considered in conjunction with the accompanying drawings, and the novel features set forth in the appended claims.

BRIEF DESCRIPTION OF THE DRAWINGS

FIG. 1 is a simplified illustration of a edge polishing apparatus. A plurality of semiconductor wafers 10 are held together by clamping plates 12 which rotate around shafts 13 and 14. The wafers have spacers 11 sandwiched between the wafers. The stack of wafers is rotated, for example, in the direction of arrow 23.

Figure 1:
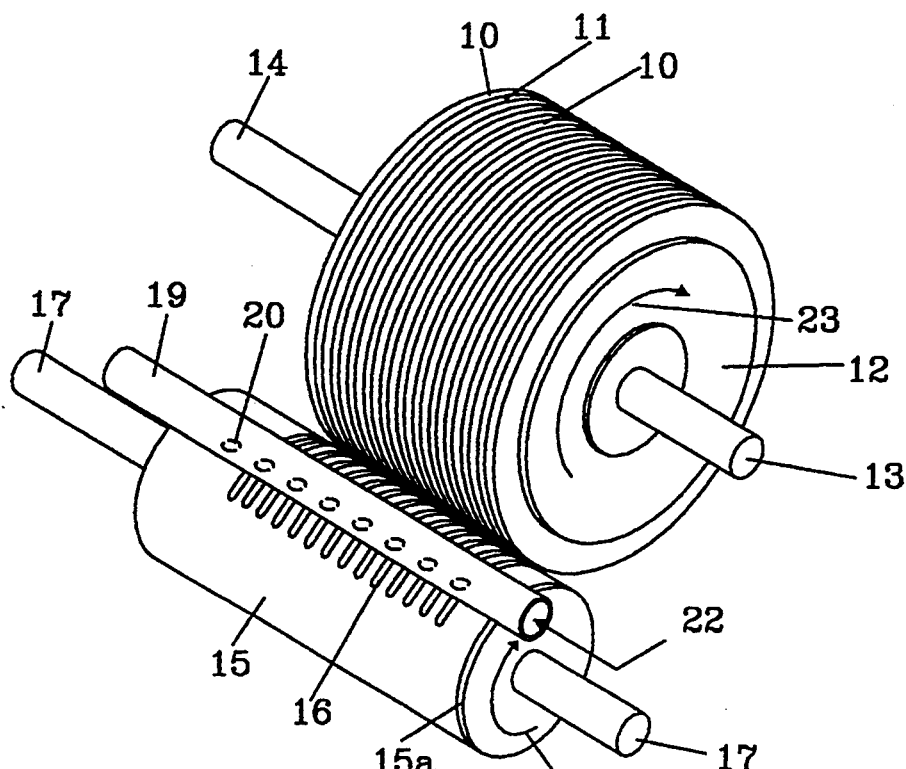
FIG. 1 shows a typical edge polishing apparatus.

The wafers are rotated against roller 15 which has a pad 15a on its surface. The wafer edges are in contact with pad 15a. Roller 15 is rotated by shafts 17, for example, in the direction of arrow 24. As the wafers and roller are rotated, a chemo-mechanical slurry mixture is applied by dispenser 19 through holes 20. Slurry is introduced into dispenser at its end, as shown by arrow 22.

Roller pad 15a has a series of grooves 16 that extend into the surface of the pad and partially around the outer circumference of pad 15a. Grooves 16 are spaced such that an edge of a wafer enters a groove as the wafers and roller are rotated. The edge of a wafer is in a groove only during a part of a complete rotation since each groove does not extend completely around the outer circumference of pad 15a.

As roller 15 rotates, the edges of the semiconductor wafers are moved into and out of grooves 16 alternately polishing the edge and the sides of the edge to provide a polished tapered edge on the semiconductor wafer.

Figure 2:
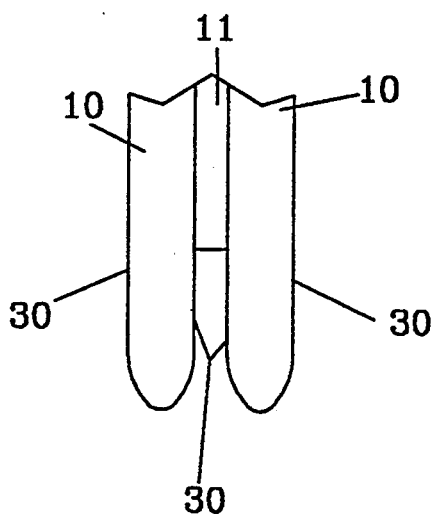
FIG. 2 shows exposed areas of wafer during polishing that can be damaged.

FIG. 2 shows a part of the mounted wafers, for example, two wafers mounted between spacers 11, and the exposed back surface 30 of the wafers that is not protected during polishing. If the exposed back surface is not protected, the surface, including backside damage done during a previous step could be scratched or etched by slurry residue. The front surface need not be protected because any slight etching will be removed during the polish operation.

Figure 3:
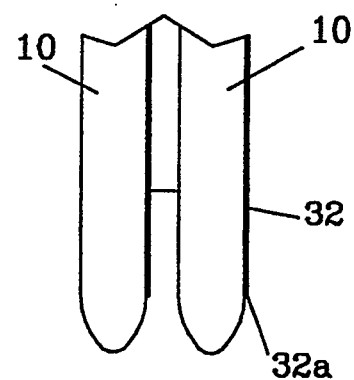
FIG. 3 shows the surface protection applied to the present invention.

FIG. 3 shows a mounted semiconductor wafer 10 with a layer 32 of silicon oxide or silicon nitride on its back surface side. The protection to the back surface of the semiconductor wafer is accomplished by applying a layer of material to the backside layer 32 of the semiconductor wafer that is known to protect against particles, scratches, and etching by mild caustic solutions. The backside layer 32 remains in place, and the layer edge 32a is not lifted during edge pre-polish, mirror edge polish, and wafer polish.

The layer is of an oxide or nitride layer such as deposited by a CVD or plasma reactor. One layer used, for example, is an oxide layer of Silox. Any portion of a layer that wraps around the wafer edge can be abraded away by the abrasive wheel prepolish without lifting the layer. The layer protects the wafer back surface during the chem-mechanical mirror edge polish step without introducing a high friction or self-adhesive layer.

The existing clean up process after polishing includes a hydrofluoric acid treatment, which removes the back surface layer without any added chemical step.

Figure 4:
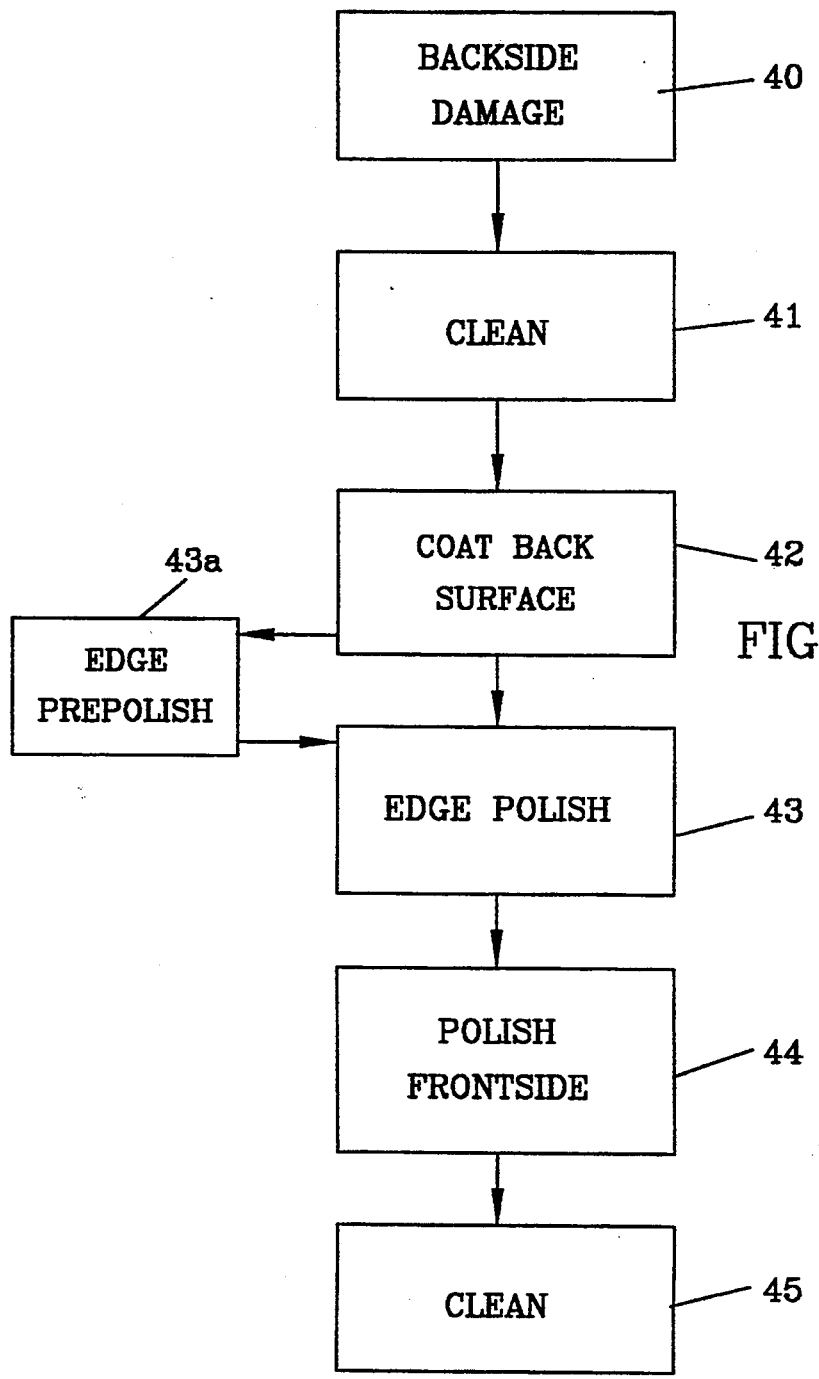
FIG. 4 is a process diagram showing the steps of the invention.

FIG. 4 illustrates basic steps in wafer preparation. In block 40, the backside of the wafer is submitted to an abrasive action to cause backside damage to the wafer. Such a process may include "sand blasting" with abrasive particles. In step 41, the wafer is cleaned to remove particles created during backside damage. In step 42, the back surface of the wafer is coated with the coating material as shown in FIG. 3.

Coated wafers are mounted as illustrated in FIG. 1 and submitted to edge polishing (step 43), however, the coating layer 32 (FIG. 3) protects the back surface of the wafer, and only the coating at the edges of the wafer are removed. The remaining portion of the layer is not lifted or otherwise removed from the surface of the wafer. A pre-polish step 43a may also be included.

The edge polished wafers are then mounted in a surface polisher, step 44, to provide a chem-mechanical, damage-free polish to the front side of the wafer. Normally in polishing the wafer, the wafer would be wax mounted or placed in a template with the wafer position in the template with the backside on a pad to protect the backside from the mounting surface of the polishing machine, However, because of the protective coating 32 on the back side of the wafer, the wafer may be mounted directly on the mounting surface of the polishing machine. The mounting surface, usually an aluminum or ceramic material will not scratch the surface of the wafer because of layer 32 thereon.

After the front side has been polished, the wafer undergoes a cleaning process to remove slurry residue and particles step 45. If the wafer has a back surface coating of silicon oxide, it will be removed also because hydrofluoric acid is used.

What is claimed:

1. A process for preparing the surfaces of a semiconductor wafer having a back and front surfaces and edges, comprising the steps of:
    abrasively damaging the back surface of the semiconductor wafer;
    coating the back surface of the wafer with a protective layer of a deposited material;
    edge polishing the edges of the wafer;
    polishing the front surface of the wafer and providing a damage-free finish to the front surface of the wafer; and
    removing the protective layer from the back surface of the wafer.

2. The method according to claim 1, wherein the protective layer applied to the back surface of the semiconductor wafer is a silicon oxide.

3. The method according to claim 1, wherein the protective layer applied to the back surface of the semiconductor wafer is a silicon nitride.

4. The method according to claim 1, including the step of cleaning the semiconductor wafer after the abrasively damaging the back surface of the semiconductor wafer to remove particles of material used during abrasively damaging the back surface of the semiconductor wafer and other debris caused during the abrasively damaging step.

5. The method according to claim 1, including the step of mounting the back surface of the semiconductor wafer with the protective layer thereon directly onto a mounting plate during polishing of the front surface.

6. A process for preparing the surfaces of a semiconductor wafer having back and front surfaces, comprising the steps of:
    abrasively damaging the back surface of the semiconductor wafer;
    the back surface of the wafer with a protective layer of a deposited material selected from one of silicon oxide and silicon nitride;
    edge polishing the edges of the wafer;
    polishing the front surface of the wafer to provide a damage-free finish to the front surface of the wafer; and
    removing the protective layer from the back surface of the wafer.

7. The method according to claim 6, including the step of cleaning the semiconductor wafer after abrasively damaging the back surface of the semiconductor wafer to remove particles of material used to abrasively damage the surface of the semiconductor wafer, and other debris caused during the backside damage step.

8. The method according to claim 6, including the step of positioning the back surface of the semiconductor wafer with the protective layer thereon directly onto a mounting plate during polishing of the front surface, without wax mounting or backing with a poromeric film.

* * * * *